United States Patent [19]
Ahn et al.

[11] Patent Number: 5,258,956
[45] Date of Patent: Nov. 2, 1993

[54] HIGH SPEED SENSING DEVICE IN A SEMICONDUCTOR MEMORY DEVICE

[75] Inventors: Gye-Ho Ahn, Seoul; Myoung-Ho Bae, Suwon, both of Rep. of Korea

[73] Assignee: SamSung Electronics Co., Ltd., Suwon, Rep. of Korea

[21] Appl. No.: 775,560

[22] Filed: Oct. 15, 1991

[30] Foreign Application Priority Data

Aug. 14, 1991 [KR] Rep. of Korea .............. 1991-14097

[51] Int. Cl.[5] .............................................. G11C 7/00
[52] U.S. Cl. ................................... 365/204; 365/149; 365/189.09; 365/206; 307/296.1
[58] Field of Search ................ 365/189.11, 190, 202, 365/204, 203, 149, 233; 307/482, 578

[56] References Cited

U.S. PATENT DOCUMENTS

| | | | |
|---|---|---|---|
| 71,093 | 4/1887 | Kitano | 365/203 |
| 4,503,522 | 3/1985 | Etoh et al. | 365/203 |
| 4,704,706 | 11/1987 | Nakano et al. | 365/203 |
| 4,811,903 | 3/1989 | Watanabe | 365/149 |
| 4,980,863 | 12/1990 | Ogihara | 365/190 |

Primary Examiner—Eugene R. LaRoche
Assistant Examiner—Vu A. Le
Attorney, Agent, or Firm—Robert E. Bushnell

[57] ABSTRACT

The present invention for increasing the sensing speed of the input/output line by preventing the potential difference between the bit line pair from being decreased when the bit line is connected to input/output line in a DRAM. A semiconductor memory device has a column gate connected between a bit line pair and an input/output line pair. A sense amplifier with a discharging node is connected to the bit line pair, and a pull down transistor has an electrode for controlling a current flow path which is disposed between the discharging node and a ground voltage node. A PMOS transistor has a channel between the charging node and an output node connected to the control electrode of the pull down transistor, and has a gate connected to a given first signal. A NMOS transistor has a channel between the output node and the ground voltage node, and has a gate connected to the first signal. A first booster receiving the first signal, has a first capacitor operating according to the first signal, being connected to the output node, and a second booster receiving a given second signal, has a second capacitor operating according to the second signal, being connected to the output node. A control signal generating circuit receives the second signal in order to generate a control signal to the column gate.

25 Claims, 4 Drawing Sheets (Conventional)

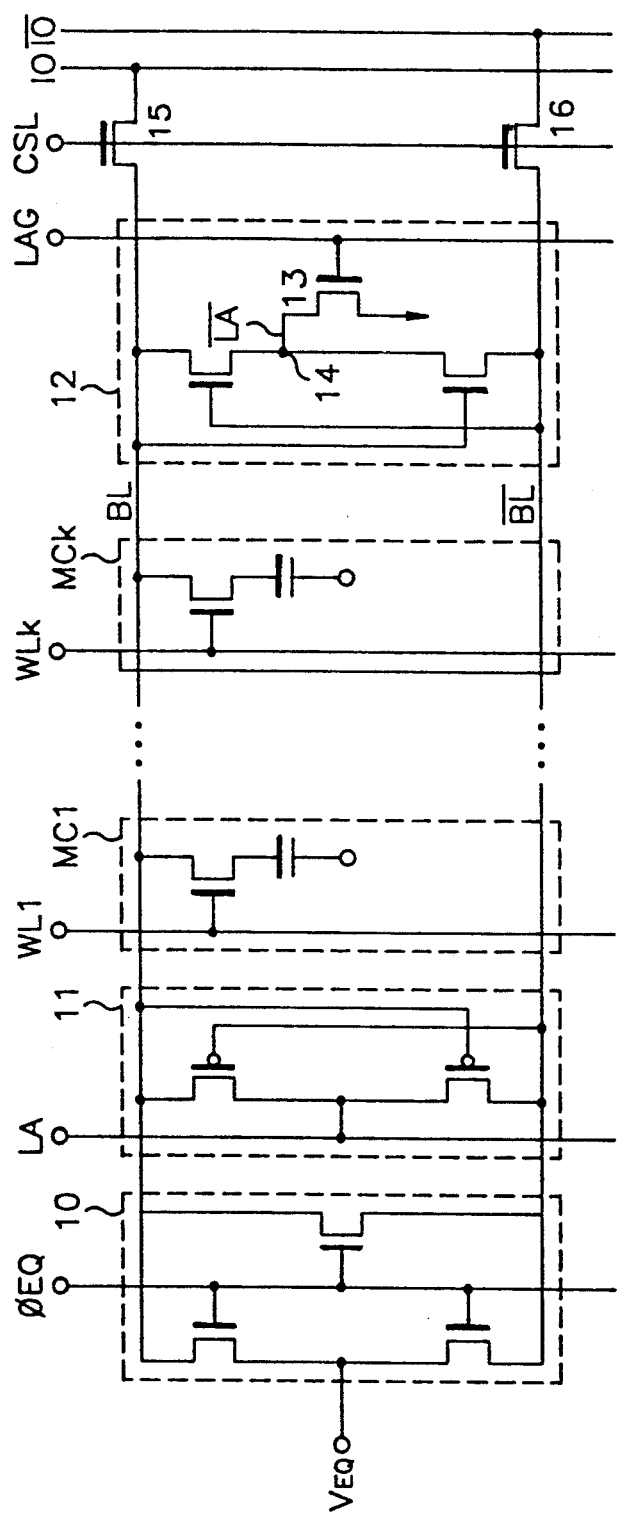
FIG. 1 (Conventional)

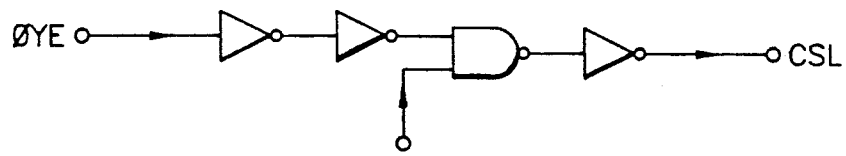
COLUMN PRE-DECODER
(Conventional)
FIG. 2B

HIGH SPEED SENSING DEVICE IN A SEMICONDUCTOR MEMORY DEVICE

BACKGROUND OF THE INVENTION

The present invention relates to a semiconductor memory device, particularly to a sensing device which senses a voltage on a bit line with an input/output line.

In a dynamic random access memory (DRAM), information of a memory cell is presented on a bit line in the form of voltage by a sense amplifier, and this voltage is sent to an input/output line by column decoding. A voltage difference between a bit line pair corresponding to a bit information is sufficiently amplified by the sense amplifier. When data read from a memory cell is sent to an input/output line, charge sharing occurs twice. First, when charge saved in the memory cell flows into the bit line because of word line driving, and second, when charge in the bit line is loaded on the input/output line.

Referring to a column circuit of a dynamic RAM in FIG. 1, a bit line equivalent signal $\phi$EQ is disabled in "low" state and a word line WL1 is operated, and thereafter charge in a memory cell MC1 is sent to the bit line BL. At this time, a reference potential of a given level by a dummy cell is presented on the bit line $\overline{BL}$. When n-type sense amplifier 12 comprised of NMOS transistors cross-coupled between the bit line pair BL, $\overline{BL}$ is enabled by a sensing clock LAG of "high" state, voltage difference between the bit line pair BL, $\overline{BL}$ is amplified. When the voltage difference between the bit line pair BL, $\overline{BL}$ is sufficiently amplified, a column selection signal CSL is enabled in "high" state, to thereby connect the bit line pair to input/output line pair. Signals and clocks, however, used in this sensing and sending process, are generated inside the semiconductor memory device.

FIG. 2A shows a conventional circuit for generating the sensing clock LAG. Referring to the conventional sensing clock generating circuit shown in FIG. 2A and a conventional sensing timing diagram shown in FIG. 2C, when the strobe clock $\phi$S according to an enabled row address strobe signal $\overline{RAS}$ is enabled in "high" state, a PMOS transistor is turned on and the sensing clock LAG is enabled in "high" state. Then, as shown in FIG. 1, a pull down NMOS transistor 13 in a n-type sense amplifier 12 is turned on and current $I_s$ flows into a ground voltage terminal Vss from a discharging node 14, so that the n-type sense amplifier 12 is driven. When the voltage difference between the bit line pair is sufficiently high, as shown in FIG. 2B, the column selection signal CSL corresponding to a signal output from a column pre-decoder (not shown) and a column gate signal $\phi$YE, is enabled in "high" state, to thereby connect the bit line pair to an input/output line pair IO/$\overline{IO}$. In this case, like a dotted circle shown in FIG. 2C, charge sharing of the input/output line and the bit line causes the voltage difference between the bit line pair to be reduced to $\Delta$VBL. The input/output line, conventionally known, is precharged and equalized to $V_{cc}-V_{th}$. When the bit line and the input/output line are connected, charge sharing is inevitable. So heavily reduced voltage difference between the bit line pair as described above causes data access time on the input/output line to be delayed. Therefore, there are occasions when a high density and high speed dynamic RAM cannot achieve desired speed operation because of delayed sensing time.

SUMMARY OF THE INVENTION

Therefore, an object of the present invention is to provide a semiconductor memory device which improves speed for sensing an input/output line in a dynamic RAM.

According to an aspect of the present invention, a semiconductor memory device has a column gate connected between a bit line pair and an input/output line pair. A sense amplifier with a discharging node is connected to the bit line pair, and a pull down transistor has an electrode for controlling a current flow path which is disposed between the discharging node and a ground voltage node. A PMOS transistor has a channel between the charging node and an output node connected to the control electrode of the pull down transistor, and has a gate connected to a given first signal. A NMOS transistor has a channel between the output node and the ground voltage node, and has a gate connected to the first signal. A first booster receiving the first signal, has a first capacitor operating according to the first signal, being connected to the output node, and a second booster receiving a given second signal, has a second capacitor operating according to the second signal, being connected to the output node. A control signal generating circuit receives the second signal in order to generate a control signal to the column gate.

BRIEF DESCRIPTION OF THE DRAWINGS

For a better understanding of the invention and to show how the same may be carried into effect, reference will now be made, by way of example, to the accompanying diagrammatic drawings, in which:

FIG. 1 is a column circuit of a dynamic RAM;

FIG. 2B is a general circuit for generating a column selection signal;

DESCRIPTION OF THE PREFERRED EMBODIMENTS

Figure 2A:
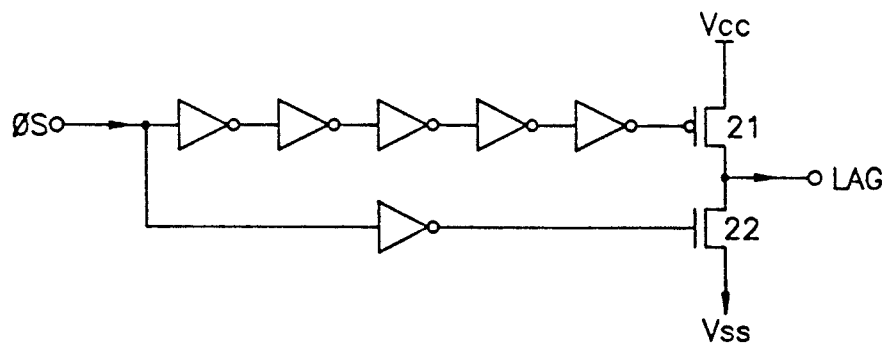
FIG. 2A is a conventional sensing clock generation circuit diagram.

It is illustrated that an entire data sending process is completed through a circuit shown in FIG. 1, and that a column selection signal is generated through a circuit shown in FIG. 2B. The present invention uses a sensing clock generator of FIG. 3 in order to achieve an object of the present invention.

Figure 3:
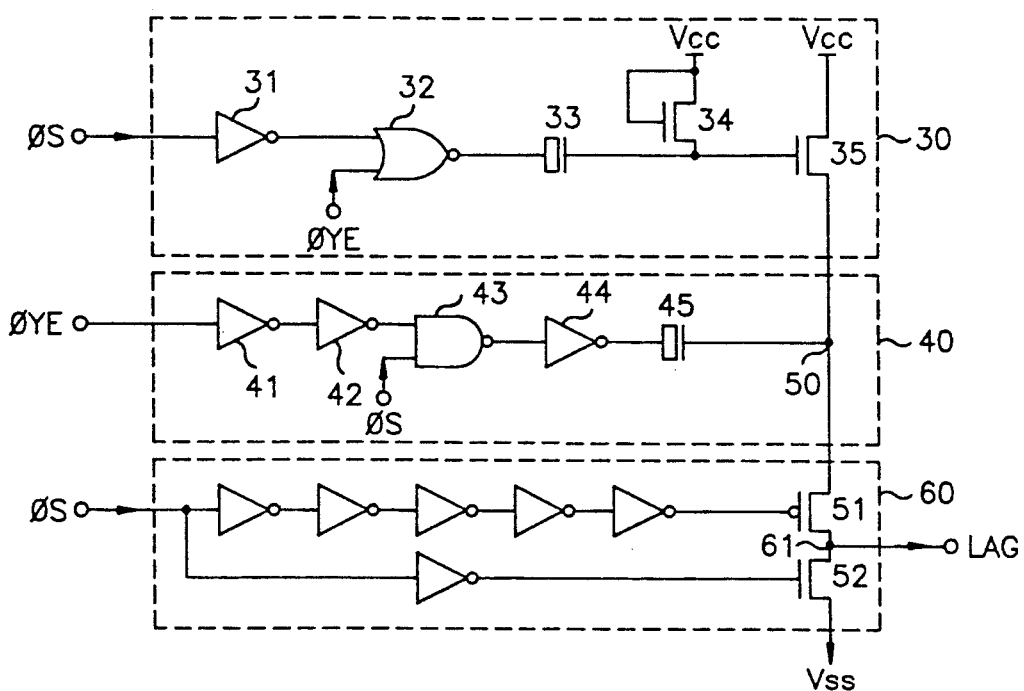
FIG. 3 is a sensing clock generation circuit according to the present invention.

Referring to FIG. 3, the sensing clock generator according to the present invention is composed of first and second boosters 30, 40 which receive a strobe clock $\phi$S and a column gate clock $\phi$YE respectively, and a main driver 60. The main driver 60 is the same as the conventional one shown in FIG. 2A. In the first booster 30, the strobe clock $\phi$S is applied to an inverter 31. The signal output from the inverter 31 is applied to one of two input terminals of a NOR gate 32, while the column gate clock φYE is applied to another input terminal. The signal output from the NOR gate 32 is applied to an electrode of a first capacitor 33, and another electrode thereof is connected to a gate of a NMOS transistor 35 having a channel between a voltage supplier Vcc and a charging node 50. In the second boost circuit 40, the column gate clock φYE being passed through two inverters 41, 42 and the strobe clock φS are applied to a NAND gate 43. The signal output from the NAND gate 43 is applied to an electrode of a second capacitor 45, passing through an inverter 44. Another electrode of the second capacitor 45 is connected to the charging node 50. The charging node 50 is connected to a source of a PMOS pull-up transistor 51 in the main driver 60.

Figure 4:
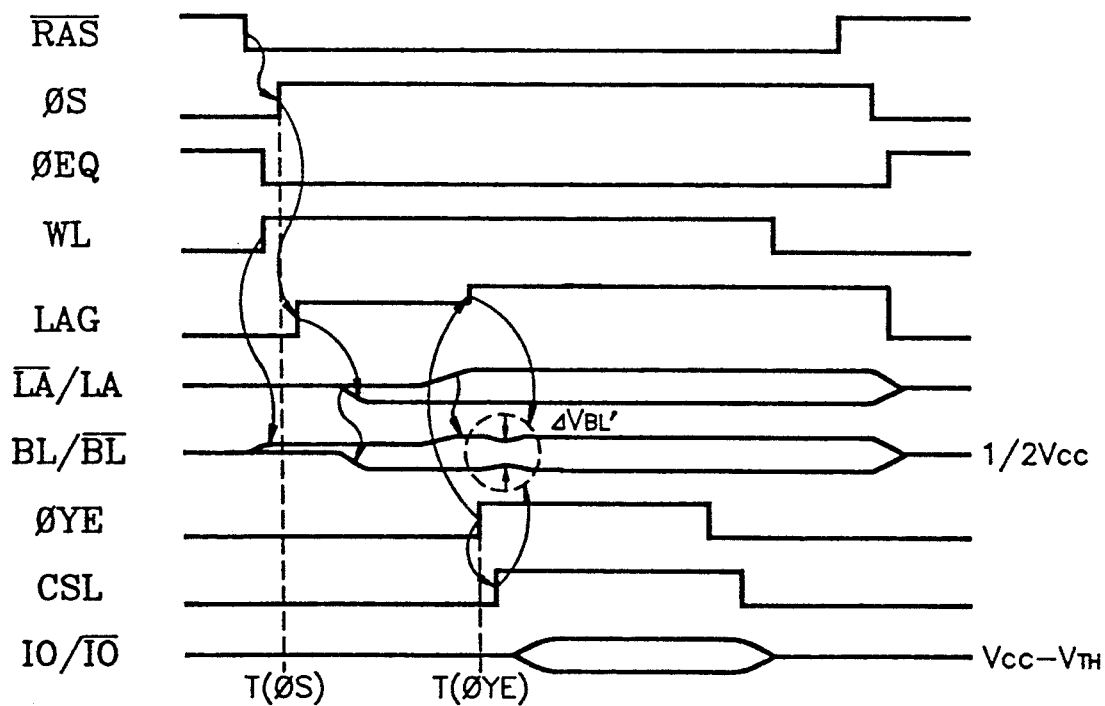
FIG. 4 is a timing diagram for showing a sensing operation according to the present invention.

A sensing operation of the present invention using the sensing clock generator of FIG. 3 will now be described with reference to the timing diagram of FIG. 4. In FIG. 4, waveforms of the strobe clock φS and the gate clock φYE, a sensing clock LAG are asked to be observed. Before the strobe clock φS is enabled, that is, before a time T(φS), both φS and φYE are in "low" state. Then, in the first booster 30, because the signal output from the NOR gate 32 is in "low" state, the first capacitor 33 applies a low voltage to the gate of the NMOS transistor 35. Previous to this, the gate of the NMOS transistor 35 supported a voltage of $V_{cc} - V_{th}$ ($V_{th}$ is a threshold voltage of the NMOS transistor) by a NMOS transistor 34 used for loading. When the NMOS transistor 35 is turned on, the voltage of the charging node 50 is $V_{cc} - 2V_{th}$.

In the second boost circuit 40, before the column gate clock φYE is enabled in "high" state, the signal output from the NAND gate 43 remains in a "high" state in which the second capacitor 45 cannot do a charge pumping operation. Accordingly, the charging operation of the charging node 50 is done by the first boost circuit 30 by the time that the column gate clock φYE is enabled.

When the strobe clock φS is enabled at the time T(φS), the charging node 50 is charged to $V_{cc}$ from $V_{cc} - 2V_{th}$ because a higher voltage than $V_{cc}$ is applied to the gate of the NMOS transistor 35 with charge pumping operation of the first capacitor 33 in the first booster 30. The output node 61 in the main driver 60, is filled up with the voltage of the charging node 50, because the PMOS transistor 51 in the main driver 60 is turned on. Being in a "high" state of power supply voltage level, the sensing clock LAG makes the NMOS transistor 13 in the n-type sense amplifier 12 of FIG. 1 turn on and the potential of the sensing node $\overline{LA}$ to be dropped to a ground potential. In this case, because the n-type sense amplifier 12 begins to operate, the potential of a complimentary bit line $\overline{BL}$ (or bit line BL) drops to ground potential. As the potential difference between the bit line pair becomes higher, the p-type sense amplifier 11 is operated. Increasing the potential of the bit line (or the complimentary bit line $\overline{BL}$) to the power supply voltage, the p-type sense amplifier 11 carries out a restoring operation.

Figure 2C:
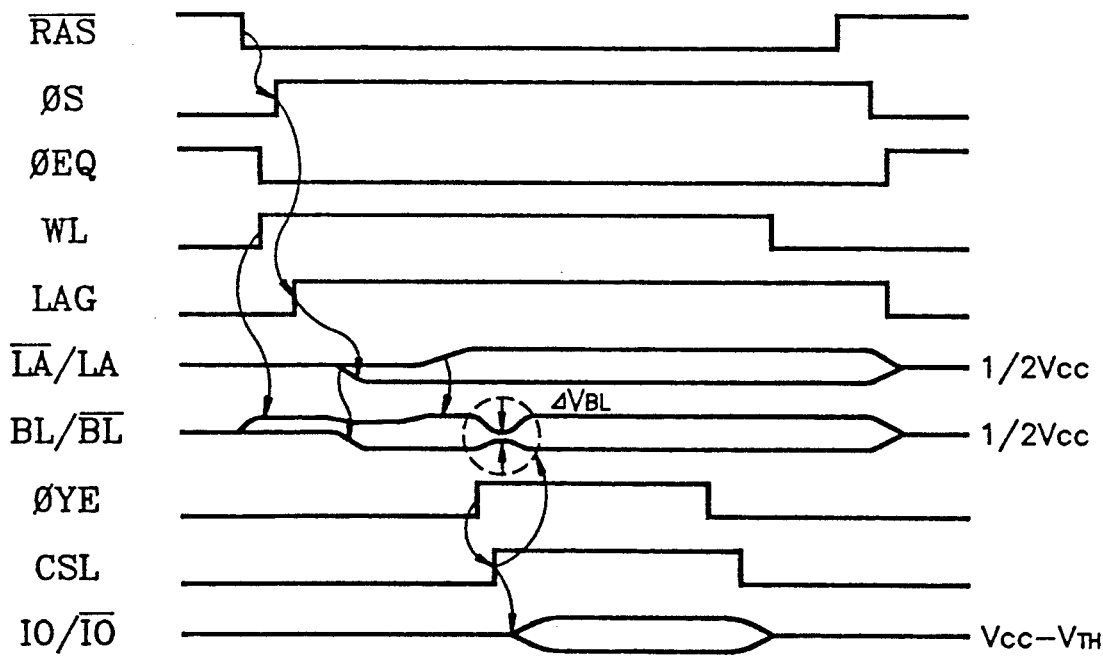
FIG. 2C is a timing diagram for showing a conventional sensing operation.
Figure 5:
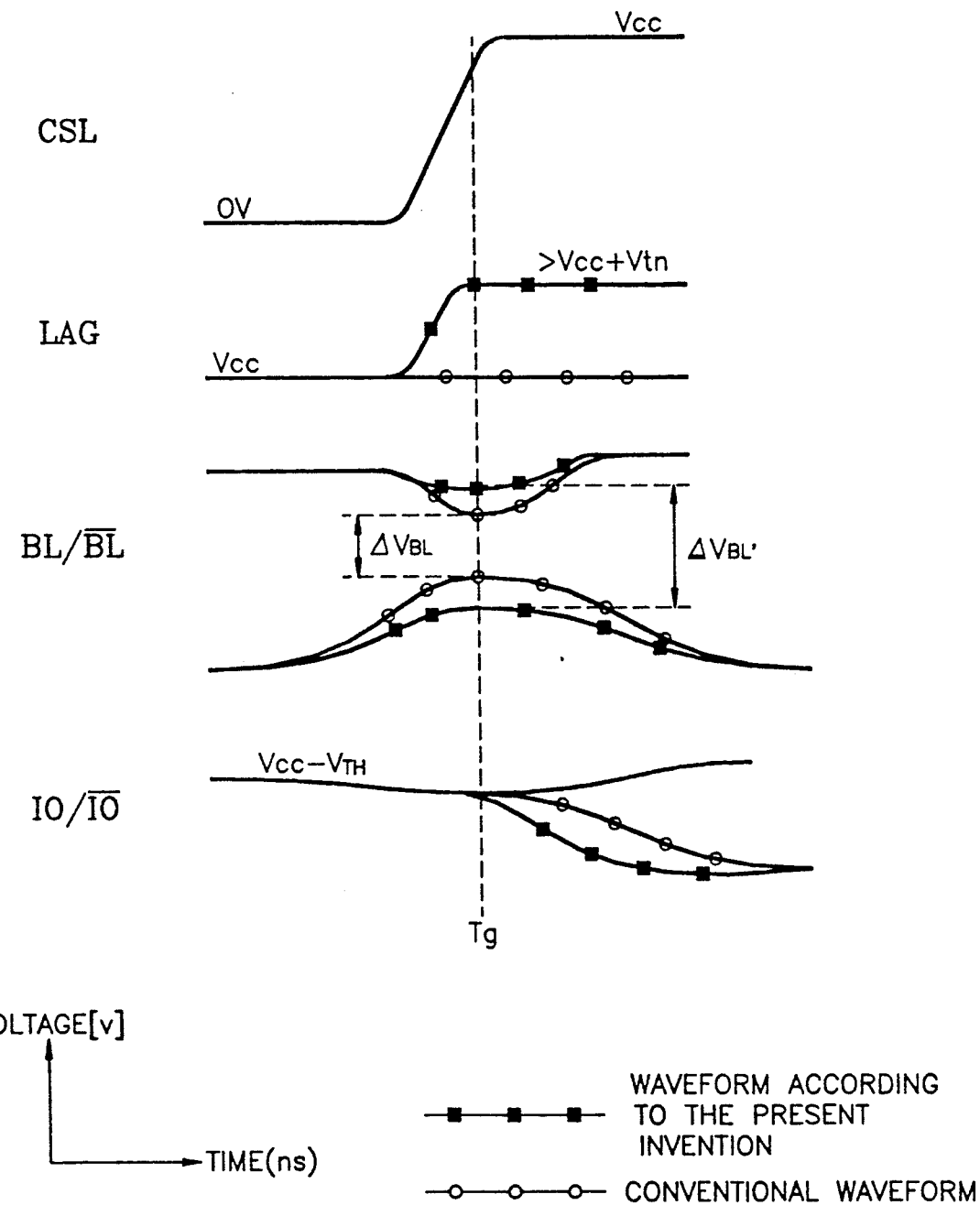
FIG. 5 is a voltage wave diagram for comparing a conventional operation with an operation of the present invention while connecting a bit line to an input/output line.

At a time T(φYE), when a column selection signal CSL is enabled in "high" state according to the activated column gate clock φYE, the bit line pair BL, are connected to the input/output line pair IO, $\overline{IO}$. As described above, the column selection signal CSL is generated through a circuit of FIG. 2B. In this case, in the second boost circuit 40, the "low" state signal output from the NAND gate 43 applies a pumping clock of "high" state to one electrode of the second capacitor 45. Then, the charging node 50 has a potential value higher than $V_{cc} + V_{th}$. Therefore, current driving capacity of the pull down NMOS transistor 13 in the n-type sensing amplifier 12 is increased due to the higher potential of the sensing clock LAG. Since the input/output lines are pre-charged and equalized with $V_{cc} - V_{th}$ level, charges in the input/output line may flow into the bit line pair BL, $\overline{BL}$ reversely at the portion when the bit lines and the input/output line are connected. In this case, however, the sensing clock with increased potential makes the reversely flowed charges discharge through a discharging node 14. Consequently, the potential difference ΔVBL' between the bit line pair is larger than the conventional potential difference ΔVBL shown in FIG. 2C, and this is easily understood through FIG. 5.

From the foregoing description, according to the present invention, the sensing speed of the input/output line and the data access speed, in dynamic RAM, are increased by restraining the potential difference between the bit line pair from being decreased by the charge distribution, when the bit line and the input/output line are connected.

While the invention has been particularly shown and described with reference to a preferred embodiment, it will be understood by those skilled in the art that modifications in detail may be made without departing from the spirit and scope of the invention.

What is claimed is:

1. A high speed sensing device for use in a semiconductor memory device having a column gate connected between a bit line pair and an input/output line pair, said high speed sensing device comprising:
   sense amplifier means comprising a discharging node, connected between said bit line pair;
   pull down transistor means comprising a current flow path connected between said discharging node and a ground voltage node, and comprising a control electrode for controlling said current flow path;
   an output node being connected to said control electrode of said pull down transistor means;
   a charging node;
   a PMOS transistor responding to a first signal, comprising a channel between said charging node and said output node;
   a NMOS transistor responding to said first signal, comprising a channel between said output node and said ground voltage node;
   first booster means for providing a first voltage to said charging node by discharging a first capacitor, said first booster means comprising NOR gate means for providing an output connected to a first electrode of the first capacitor by receiving both an inverted said first signal and a second signal, and an insulation gate field effect transistor with a gate connected to a second electrode of the first capacitor and a channel between a power supply voltage node and said charging node;
   second booster means for providing a second voltage to said charging node by discharging a second capacitor, said second booster means comprising a second capacitor; and
   control signal generating means receiving said second signal, for generating a control signal to said column gate.

2. The high speed sensing device according to claim 1, wherein said first signal depends upon a row address strobe signal.

3. The high speed sensing device according to claim 1, wherein said second signal is generated from a column decoder.

4. The high speed sensing device according to claim 1, wherein said second booster means further comprises:
   NAND gate means receiving a delayed said first signal and said second signal; and
   inverter means for inverting an output from said NAND gate means and applying the inverted output to a first electrode of said second capacitor, a second electrode of said second capacitor being connected to said charging mode.

5. The high speed sensing device according to claim 1, wherein said control signal generating means comprises:
   NAND gate means receiving said second signal and a column address signal; and
   inverter means for inverting a signal output from said NAND gate and supplying the inverted signal to said column gate.

6. The high speed sensing device according to claim 1, wherein a gate of said PMOS transistor receives a delayed inverted said first signal, and a gate of the NMOS transistor receives an inverted said first signal.

7. A high speed sensing device for use in a semiconductor memory device comprising sense amplifier means comprised of two NMOS transistors, gates of said NMOS transistors being cross coupled between a bit line pair, said high speed sensing device comprising:
   pull down means comprising a current flow path connected between a ground voltage node and a discharging node disposed between said NMOS transistors, and comprising a control electrode for controlling said current flow path;
   a charging node;
   main driver means connected between said charging node and said ground voltage node, for controlling said pull down means, responding to a first signal;
   first booster means for providing a first voltage to said charging node by discharging a first capacitor, said first booster means comprising NOR gate means for providing an output connected to a first electrode of the first capacitor by receiving both an inverted said first signal and a second signal, and an insulation gate field effect transistor with a gate connected to a second electrode of the first capacitor and a channel between a power supply voltage node and said charging node; and
   second booster means for providing a second voltage to said charging node by discharging a second capacitor, said second booster means comprising the second capacitor responding to said second signal.

8. The high speed sensing device according to claim 7, wherein said charging node is a voltage source of said main driver means.

9. The high speed sensing device according to claim 7, wherein said main driver means comprises:
   pull up transistor means comprising a channel connected between said charging node and said control electrode, and a gate connected to a delayed inverted signal of said first signal; and
   pull down transistor means comprising a channel connected between said control electrode and said ground voltage node, and a gate connected to an inverted signal of said first signal.

10. The high speed sensing device according to claim 7, wherein said first signal depends upon a row address strobe signal.

11. The high speed sensing device according to claim 7, wherein said second signal is generated from a column decoder.

12. The high speed sensing device according to claim 7, wherein said second voltage is higher than the first voltage.

13. The high speed sensing device according to claim 8, wherein said main driver means comprises:
   pull up transistor means comprising a channel connected between said charging node and said control electrode, and a gate connected to a delayed inverted signal of said first signal; and
   pull down transistor means comprising a channel connected between said control electrode and said ground voltage node, and a gate connected to an inverted signal of said first signal.

14. The high speed sensing device of claim 7, wherein said second booster means comprises:
   a delay circuit delaying said first signal;
   NAND gate means receiving the delayed said first signal and said second signal; and
   inverter means for inverting an output of said NAND gate means and applying the inverted output to a first electrode of said second capacitor, a second electrode of said second capacitor being connected to said charging node.

15. A semiconductor memory sensing device comprising a column gate connected between a bit line pair and an input/output line pair, said sensing device comprising:
   a sense amplifier comprising a discharging node, connected between said bit line pair;
   pull down transistor means comprising a current flow path connected between said discharging node and a reference voltage node, and a control electrode for controlling said current flow path;
   an output node formed by said control electrode of said pull down transistor;
   a charging node;
   a second transistor responding to a first signal, comprising a channel between said charging node and said output node;
   a third transistor responding to said first signal, comprising a channel between said output node and said reference voltage node; and
   capacitive means coupled to said charging node, for respectively charging said charging node to a first level in response to said first signal and charging said charging node to a second and different level in response to a second signal, said capacitive means comprising:
   first and second capacitors;
   a power supply voltage node;
   first gate means for providing a first gate signal in response to an inverted said first signal and said second signal, said first gate means comprising an output connected to a first electrode of said first capacitor;
   an insulation gate field effect transistor comprising a gate electrode connected to a second electrode of said first capacitor, and a channel coupled between said power supply voltage node and said charging node;
   second gate means for providing a second gate signal in response to said first and second signals; and inverter means for inverting said second gate signal and applying said inverted second gate signal to a first electrode of said second capacitor, a second electrode of said second capacitor being connected to said charging node.

16. A sensing device for increasing sensing speed in a semiconductor memory, said device comprising:

first booster means for providing a first voltage to a charging node by discharging a first capacitor, said first booster means comprising a first inverter inverting a first signal, a first logic gate providing a first gate signal in response to said inverted first signal and a second signal, said first capacitor with a first electrode receiving said first gate signal, a first negative metal oxide semiconductor transistor with a drain connected to a second electrode of the first capacitor and a gate and a source both connected to a source voltage, and a second negative metal oxide semiconductor transistor with a gate connected to the second electrode of the first capacitor, a source connected to the source voltage and a drain connected to the charging node; and second booster means for providing a second voltage to the charging node by discharging a second capacitor.

17. The sensing device of claim 16, wherein said second booster means comprises:

a delay circuit delaying said second signal;

a second logic gate providing a second gate signal in response to said delayed second signal and said first signal;

a second inverter inverting said second gate signal; and a second capacitor with a first electrode receiving said inverted second gate signal and a second electrode connected to the charging node.

18. The sensing device of claim 16, further comprising a main driver comprising:

delay and inversion means for providing a delayed inverted signal by delaying and inverting said first signal;

a second inverter inverting said first signal;

a positive metal oxide semiconductor transistor with a gate receiving said delayed inverted signal, a source connected to the charging node, and a drain providing a sensing clock signal; and a third negative metal oxide semiconductor transistor with a gate receiving said inverted signal from said second inverter, and a channel connected between a drain of the positive metal oxide semiconductor transistor and ground.

19. The sensing device of claim 18, further comprising:

a sensing amplifier connected between a pair of bit lines, said sensing amplifier operating in response to said sensing clock signal.

20. A sensing device for increasing sensing speed in a semiconductor memory, said sensing device comprising:

first booster means for providing a first voltage to a charging node by discharging a first capacitor; and second booster means for providing a second voltage to the charging node by discharging a second capacitor, said second booster means comprising a delay circuit delaying a first signal, a logic gate providing a gate signal in response to said delayed first signal and a second signal, an inverter inverting said gate signal, and the second capacitor comprising a first electrode receiving said inverted gate signal and a second electrode connected to the charging node.

21. A method in a semiconductor device of restraining a difference in voltage potential between a bit line pair when said bit line pair and an input/output line pair are connected, said method comprising the steps of:

providing a first voltage to a charging node by discharging a first capacitor in a first circuit comprising a first inverter inverting a first signal, a first logic gate providing a first gate signal in response to said inverted first signal and a second signal, said first capacitor with a first electrode receiving said first gate signal, a first negative metal oxide semiconductor transistor with a drain connected to a second electrode of the first capacitor and a gate and a source connected to a source voltage, and a second negative metal oxide semiconductor transistor with a gate connected to the second electrode of the first capacitor, a source connected to the source voltage and a drain connected to the charging node; and providing a second voltage to the charging node by discharging a second capacitor.

22. The method of claim 21, wherein the step of providing a second voltage comprises:

providing the second voltage to the charging node by discharging the second capacitor in a second circuit comprising a delay circuit delaying said second signal, a second logic gate providing a second gate signal in response to said delayed second signal and said first signal, a second inverter inverting said second gate signal, and the second capacitor with a first electrode receiving said inverted second gate signal and a second electrode connected to the charging node.

23. The method of claim 22, further comprising the step of providing a sensing clock signal by:

providing a delayed inverted signal by delaying and inverting said first signal;

inverting said first signal in a second inverter;

providing said sensing clock signal at a drain of a positive metal oxide semiconductor transistor with a gate receiving said delayed inverted signal and a source connected to the charging node, a gate of a third negative oxide semiconductor transistor receiving said inverted signal from said second inverter, and a channel of the third negative oxide semiconductor transistor connected between a drain of the positive metal oxide semiconductor transistor and ground.

24. The method of claim 23, further comprising the step of driving a sensing amplifier connected between the pair of bit lines in response to said sensing clock signal.

25. A method in a semiconductor device of restraining a difference in voltage potential between a bit line pair when said bit line pair and an input/output line pair are connected, said method comprising the steps of:

providing a first voltage to a charging node by discharging a first capacitor in a first circuit; and providing a second voltage to the charging node by discharging a second capacitor in a booster circuit comprising a delay circuit delaying a first signal, a logic gate providing a gate signal in response to said delayed first signal and a second signal, an inverter inverting said gate signal, and the second capacitor comprising a first electrode receiving said inverted gate signal and a second electrode connected to the charging node.

* * * * *